US009285757B2

(12) United States Patent
Uchida (10) Patent No.: US 9,285,757 B2
(45) Date of Patent: Mar. 15, 2016

(54) MOUNTING STRUCTURE OF EXTERNAL DEVICE, AND IMAGE FORMING APPARATUS

(71) Applicant: FUJI XEROX CO., LTD., Tokyo (JP)

(72) Inventor: Tetsuo Uchida, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/479,881

(22) Filed: Sep. 8, 2014

(65) Prior Publication Data

US 2015/0277351 A1    Oct. 1, 2015

(30) Foreign Application Priority Data

Mar. 25, 2014  (JP) ................................ 2014-062104

(51) Int. Cl.
| H05K 5/00 | (2006.01) |
| H05K 5/02 | (2006.01) |
| G03G 21/16 | (2006.01) |
| G03G 21/20 | (2006.01) |

(52) U.S. Cl.
CPC ........ *G03G 21/1619* (2013.01); *G03G 21/1647* (2013.01); *G03G 21/206* (2013.01); *H05K 5/0204* (2013.01); *H05K 5/0213* (2013.01)

(58) Field of Classification Search
CPC .......... G03G 21/1604; G03G 21/1609; G03G 21/1619; G03G 21/1647; G03G 21/206; G03G 2221/1678; H05K 5/0213; H05K 5/0021; H05K 5/0073; H05K 5/0204
See application file for complete search history.

(56) References Cited

U.S. PATENT DOCUMENTS

| 5,797,213 A * | 8/1998 | Frick ...................... A01K 97/20 |
| | | 43/54.1 |
| 2008/0135215 A1* | 6/2008 | Wu ........................ H01L 23/427 |
| | | 165/104.33 |
| 2011/0262175 A1* | 10/2011 | Takahashi ............ G03G 21/206 |
| | | 399/92 |

FOREIGN PATENT DOCUMENTS

JP    A-2005-84235    3/2005

* cited by examiner

*Primary Examiner* — Joseph S Wong
(74) *Attorney, Agent, or Firm* — Oliff PLC (57) ABSTRACT

Provided is a mounting structure of an external device, including an apparatus body in which an exhaust port or a suction port are formed, an external device that is connected to the apparatus body, and a mounting member that includes a body section having one side on which the external device is mounted and the other side which is mounted on the apparatus body so as to cover the exhaust port or the suction port, and plural protruding sections which protrude from the body section and come into contact with the apparatus body in positions different from the exhaust port or the suction port, and that is provided to make flow paths at portions other than the plural protruding sections so as to intersect or branch between the body section and the apparatus body, and at a center portion of the body section.

8 Claims, 8 Drawing Sheets

MOUNTING STRUCTURE OF EXTERNAL DEVICE, AND IMAGE FORMING APPARATUS

CROSS-REFERENCE TO RELATED APPLICATIONS

This application is based on and claims priority under 35 USC 119 from Japanese Patent Application No. 2014-062104 filed Mar. 25, 2014.

BACKGROUND

Technical Field

The present invention relates to a mounting structure of an external device, and an image forming apparatus.

SUMMARY

According to an aspect of the invention, there is provided a mounting structure of an external device, including:

an apparatus body in which an exhaust port or a suction port are formed;

an external device that is connected to the apparatus body; and a mounting member that includes a body section having one side on which the external device is mounted and the other side which is mounted on the apparatus body so as to cover the exhaust port or the suction port, and plural protruding sections which protrude from the body section and come into contact with the apparatus body in positions different from the exhaust port or the suction port, and that is provided to make flow paths at portions other than the plural protruding sections so as to intersect or branch between the body section and the apparatus body, and at a center portion of the body section.

BRIEF DESCRIPTION OF THE DRAWINGS

Exemplary embodiments of the present invention will be described in detail based on the following figures, wherein.

DETAILED DESCRIPTION

An example of a mounting structure of an external device and an image forming apparatus according to an exemplary embodiment will be described.

Entire Configuration

Figure 1:
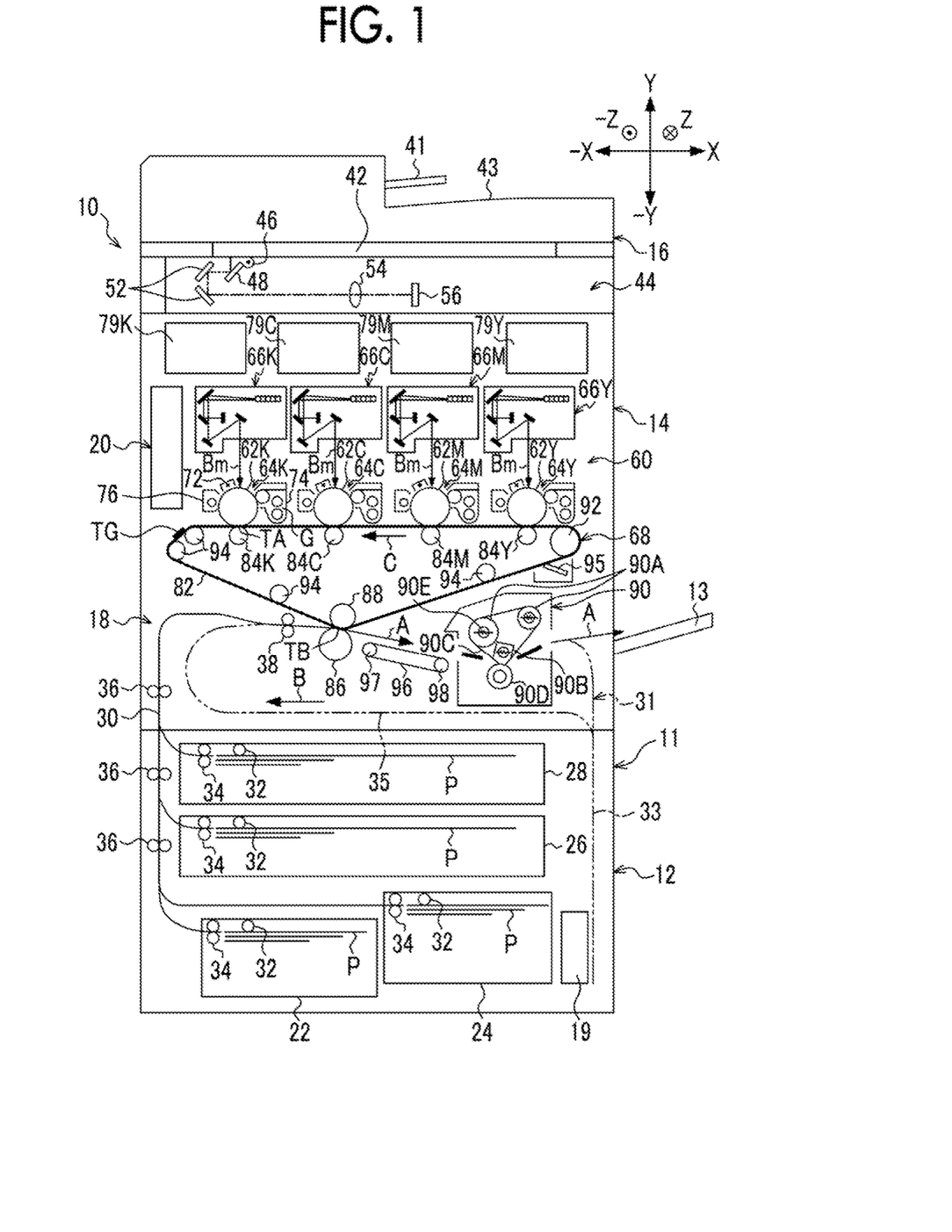
FIG. 1 is a configuration view of an entirety of an image forming apparatus according to an exemplary embodiment.

FIG. 1 illustrates an image forming apparatus 10 as an example of the exemplary embodiment. Moreover, in the following description, a direction (a Y direction) represented by arrow Y is referred to as a height direction, a direction (X direction) that is orthogonal to the Y direction and represented by arrow X is referred to as a width direction in FIG. 1. Furthermore, a direction (Z direction) orthogonal to the Y direction and the X direction respectively is referred to as a depth direction.

Furthermore, if it is necessary to distinguish one side and the other side in the X direction, the Y direction, and the Z direction, and therefore an upper side is described as Y side, a lower side is described as –Y side, a right side is described as X side, a left side is described as –X side, a rear side is described as Z side, and a front side is described as –Z side, when the image forming apparatus 10 is viewed in a front view (Z direction view). Moreover, in the exemplary embodiment, as an example, the X direction and the Z direction refer to as a horizontal direction, and the Y direction refers to as a vertical direction.

The image forming apparatus 10 has an apparatus body 11 as a housing configured of plural frame members. Furthermore, the image forming apparatus 10 is provided with a sheet accommodating section 12 in which sheets P as an example of a recording medium are accommodated, a main operation section 14 that forms an image on the sheet P, and a document reading section 16 that reads a document (not illustrated) from the lower side to the upper side in the Y direction. Furthermore, the image forming apparatus 10 is provided with a supply section 18 that supplies the sheet P to each section, a power supply section 19 that supplies power to each section, and a control section 20 that is provided in the main operation section 14 and controls an operation of each section of the image forming apparatus 10.

Sheet Accommodating Section

The sheet accommodating section 12 has a first accommodating section 22, a second accommodating section 24, a third accommodating section 26, and a fourth accommodating section 28 capable of accommodating the sheet P. The first accommodating section 22, the second accommodating section 24, the third accommodating section 26, and the fourth accommodating section 28 have a feeding roll 32 that feeds the accommodated sheets P one by one and a feed roller 34 that transports the fed sheets P to a transport path 30 provided in the image forming apparatus 10.

Supply Section

The supply section 18 has plural feed rollers 36 that are disposed on a downstream side of the transport path 30 with respect to the feed roller 34 and transport the sheets P one by one. Furthermore, an alignment roll 38 is provided on the downstream side with respect to the feed rollers 36 in the transport direction of the sheet P.

The alignment roll 38 performs alignment of image transfer by temporarily suspending the sheet P and feeding the sheet P to a secondary image transfer position TB in accordance with movement of an intermediate image transfer belt 82 described below.

A portion on the upstream side of the transport path 30 has a linear shape from the sheet accommodating section 12 on the –X direction to a lower portion of the main operation section 14 on the –X direction toward the arrow direction Y when the image forming apparatus 10 is viewed in a front view. Furthermore, a portion on the downstream side of the transport path 30 extends from the lower portion of the main operation section 14 on the –X direction to a sheet discharge section 13 that is provided in the lower portion of the main operation section 14 on the X direction. Furthermore, the transport path 30 is connected to a both-side transport path 31 in which the sheet P is transported and reversed so that the images are formed on both sides of the sheet P. Moreover, the transport direction of the sheet P is represented by arrow A when the both-side transportation is not performed.

The both-side transport path 31 has a reversing section 33 for reversing the sheet P and a delivery section 35 that delivers the reversed sheet P to the transport path 30. The reversing section 33 is linearly provided from the lower portion of the main operation section 14 on the X direction to the sheet accommodating section 12 on the X direction in the arrow direction Y in a front view of the image forming apparatus 10. The delivery section 35 is provided in a bottom portion of the main operation section 14 and a rear end of the sheet P that is transported to the reversing section 33 enters the delivery section 35, and the delivery section 35 causes the sheet P to be delivered to the transport path 30. The transport direction of the sheet P in the delivery section 35 is represented by arrow B.

Specifically, an end portion on the downstream side of the delivery section 35 is connected to the further upstream side of the transport path 30 than the alignment roll 38 by a guide member (not illustrated). Moreover, in FIG. 1, a switching member for switching the transport path 30 and the both-side transport path 31, and a switching member for switching the reversing section 33 and the delivery section 35 are not illustrated.

Document Reading Section

The document reading section 16 has a document placing table 41 on which plural documents (not illustrated) are placed, a platen glass 42 on which a sheet of a document is placed, a document reading device 44 that reads the document placed on the platen glass 42, and a document discharge section 43 that discharges the read document.

The document reading device 44 has a light irradiation section 46 that irradiates the document placed on the platen glass 42 with light, one full-rate mirror 48 and two half-rate mirrors 52 that reflect and return the light reflected from the document in a direction parallel to the platen glass 42. Furthermore, the document reading device 44 has an imaging lens 54 on which the reflected light that is returned by the full-rate mirror 48 and the half-rate mirrors 52 is incident, and a photoelectric conversion element 56 that converts the reflected light that is imaged by the imaging lens 54 into an electric signal.

The electric signal converted by the photoelectric conversion element 56 is image-processed in an image processing device 110 (see FIG. 2) described below and is used for image formation in the main operation section 14. Furthermore, the full-rats mirror 48 is moved at a full rate along the platen glass 42 and the half-rate mirrors 52 are moved at a half rate along the platen glass 42.

Main Operation Section

The main operation section 14 has an image forming section 60 that forms a toner image TG as an example of a developer image on the sheet P and a fixing device 90 that fixes the toner image TG formed on the sheet P by the image forming section 60 on the sheet P by heat and pressure.

Image Forming Section

The image forming section 60 has image forming units 64Y, 64M, 64C, 64K including image holding members 62Y, 62M, 62C, and 62K corresponding to each toners of yellow (Y), magenta (M), cyan (C), and black (K), respectively. Furthermore, the image forming section 60 has exposure units 66K, 66C, 66M, and 66Y that expose by emitting light beam Bm toward an outer circumferential surface of the image holding members 62K, 62C, 62M, and 62Y. Furthermore, the image forming section 60 has a transfer unit 68 that transfers the toner image TG formed by the image forming units 64K, 64C, and 64Y onto the sheet P.

Moreover, in the following description, if it is necessary to distinguish between Y, M, C, and K, description will be given by denoting any one of the alphabets Y, M, C, and K after the number of a symbol and if it is not necessary to distinguish Y, M, C, and K with the same configuration, the description of Y, M, C, and K will be omitted.

The exposure unit 66 is configured such that the light beam Bm emitted from a light source (not illustrated) is scanned by a polygon mirror (unsigned) and is reflected by plural optical parts including a reflecting mirror thereby emitting the light beam Bm corresponding to a toner of each color toward the image holding member 62. Furthermore, the image holding member 62 is provided on the −Y side of the exposure unit 66.

The image forming unit 64 has the cylindrical image holding member 62 that is rotatable, a charging unit 72, a developing unit 74, and a cleaning member 76 that face an outer circumferential surface of the image holding member 62 and are arranged in this order from the upstream side to the downstream side in a rotating direction. Then, the charging unit 72 and the developing unit 74 are disposed so as to apply the light beam Bm to a position between the charging unit 72 and the developing unit 74 on the outer circumferential surface of the image holding member 62. Furthermore, the intermediate image transfer belt 82 described below comes into contact with a position between the developing unit 74 and the cleaning member 76 on the outer circumferential surface of the image holding member 62.

The image holding member 62 is capable of rotating by drive of a motor (not illustrated). As an example, the charging unit 72 is configured of a charging unit of a corotron type that charges the outer circumferential surface of the image holding member 62 with the same polarity as the toner by corona discharge by applying a voltage to a wire. Here, a latent image (electrostatic latent image) is formed by applying the light beam Bm to the outer circumferential surface of the charged image holding member 62 based on the image data.

As an example, the developing unit 74 accommodates developer G in which carrier particles formed of a magnetic body and the toner that is negatively charged are mined together. Furthermore, the developing unit 74 has a cylindrical developing sleeve in which a magnetic roll (not illustrated) having plural magnetic poles is provided on the inside in a circumferential direction. Then, in the developing unit 74, a magnetic brush is formed at a position facing the image holding member 62 by rotating the developing sleeve.

Furthermore, the developing unit 74 actualizes the latent image on the outer circumferential surface of the image holding member 62 with the toner by applying developing bias to the developing sleeve by a voltage application unit (not illustrated) thereby forming the toner image TG (developer image). Moreover, the toner is supplied from each toner cartridge 79 provided above the image forming section 60 to each developing unit 74.

As an example, the cleaning member 76 is a brush roll coming into contact with the outer circumferential surface of the image holding member 62 and is adapted to scrape and collect the toner remaining on the outer circumferential surface of the image holding member 62 by the rotation thereof. Furthermore, the intermediate image transfer belt 82 that primarily transfers the toner image that is developed by the developing unit 74 is disposed on the further downstream side of the image holding member 62 than the developing unit 74 in the rotating direction.

The transfer unit 68 has the endless type intermediate image transfer belt 82, a primary image transfer roller 84 that primarily transfers the toner image from the image holding member 62 onto the intermediate image transfer belt 82, and a secondary image transfer roller 86 that secondarily transfers the toner image TG superimposed on the intermediate image transfer belt 82 onto the sheet P. As an example, the secondary image transfer roller 86 is disposed outside the intermediate image transfer belt 82 and the intermediate image transfer belt 82 is interposed between the secondary image transfer roller 86 and an auxiliary roll 88 disposed in the intermediate image transfer belt 82. Moreover, a position in which the intermediate image transfer belt 82 is interposed between the image holding member 62 and the primary image transfer roller 84 is referred to as a primary transfer position TA and a position in which the intermediate image transfer belt 82 is interposed between the secondary image transfer roller 86 and the auxiliary roll 88 is referred to as a secondary image transfer position TB.

A driving roll 92 that is driven to be rotated and plural feed rollers 94 that are rotatably provided are disposed in the intermediate image transfer belt 82. Then, the intermediate image transfer belt 82 is wound around the primary image transfer rollers 84K, 84C, 84M, and 84Y, the driving roll 92, the feed rollers 94, and the auxiliary roll 88. Therefore, the intermediate image transfer belt 82 is circularly moved in arrow direction C (counter-clockwise direction) when the driving roll 92 rotates in the illustrated counter-clockwise direction.

As an example, the primary image transfer roller 84 is configured by forming an elastic layer (not illustrated) on a periphery of a cylindrical shaft configured of a metal such as stainless steel and is capable of rotating by supporting both end portions of the shaft with a tearing. Furthermore, a voltage (positive voltage) having a polarity opposite to a polarity of the toner is applied from the power supply section 19 to the shaft of the primary image transfer roller 84.

As an example, the secondary image transfer roller 86 has the same configuration as that of the primary image transfer roller 84 and is disposed on the downstream side of the alignment roll 38, and is rotatably provided in the transport path 30. Furthermore, the secondary image transfer roller 86 comes into contact with the outer circumferential surface of the intermediate image transfer belt 82 in the secondary image transfer position TB described above.

Furthermore, she secondary image transfer roller 86 is grounded. Then, the auxiliary roll 88 forms a counter electrode of the secondary image transfer roller 86 and a secondary transfer voltage is applied to the auxiliary roll 88 through a metal power feed roll (not illustrated) coming into contact with the outer circumferential surface of the auxiliary roll 88. Here, the secondary transfer voltage (negative voltage) is applied to the auxiliary roll 88, a potential difference is generated between the auxiliary roll 88 and the secondary image transfer roller 86, and thereby the toner image TG on the intermediate image transfer belt 82 is secondarily transferred on the sheet P transported to the secondary image transfer position TB.

A transportation belt 96 that transports the sheet F onto which the secondary transfer of the toner image TG is completed to the fixing device 90 is provided on the further downstream side in the moving direction of the sheet F than the secondary image transfer roller 86 (the secondary image transfer position TB). The transportation belt 96 is wound around a driving roll 98 and a driven roll 97, and is circularly moved by the rotation of the driving roll 98.

Fixing Device

As an example, the fixing device 90 has a fixing belt 90C that is wound around two rolls 90A and a pad 90B, and a pressurizing roll 90D that pressurizes the fixing belt 90C toward the pad 90B. A heater 90E that heats the fixing belt 90C is provided in the rolls 90A. Then, the fixing device 90 fixes the toner image TG formed on the sheet P by the image forming section 60 onto the sheet P by the heat and the pressure.

Control Section

The control section 20 is configured of a computer that performs control of an entirety of the image forming apparatus 10 and performs various calculations. That is, the control section 20 has a Central Processing Unit (CPU), a Read Only Memory (ROM) accommodating various programs, a Random Access Memory (RAM) that is used for executing the program, a non-volatile memory that accommodates each information, and an input/output interface. Moreover, the CPU, the ROM, the RAM, the non-volatile memory, and the input/output interface are not illustrated.

Operation of Entire Configuration

In the image forming apparatus 10 illustrated in FIG. 1, when forming the image on the sheet P, each image holding member 62 is charged by the charging unit 72. Then, after each image holding member 62 is charged, each image holding member 62 is exposed by the light beam Bm emitted from each exposure unit 66 based on the image information that is image-processed by the image processing device 110 described below, and the electrostatic latent image is formed in the image holding member 62.

Subsequently, the electrostatic latent image formed on the outer circumferential surface of each image holding member 62 is developed as the toner image of each color of yellow (Y), magenta (M), cyan (C), and black (K) by the developing unit 74. Then, each toner image formed on the surface of each image holding member 62 is sequentially multi-transferred onto the intermediate image transfer belt 82 in the primary transfer position TA. Then, the toner image TG that is multi-transferred onto the intermediate image transfer belt 82 is secondarily transferred onto the sheet P that is transported in the transport path 30 in the secondary image transfer position TB.

Subsequently, the sheet P onto which the toner image TG is transferred is transported toward the fixing device 90 by the transportation belt 96. Then, the toner image TG on the sheet P is fixed by the fixing device 90 by being heated and pressurized. As an example, the sheet P onto which the toner image TG is fixed is discharged to the sheet discharge section 13. Thus, a series of image forming processes are performed. Moreover, when the toner image TG is formed on a non-image surface in which the image is not formed (when forming the images on both sides), the image fixing is performed on the surface by the fixing device 90 and then image forming and fixing are performed on a rear surface by delivering the sheet P to the both-side transport path 31.

Configuration of Main Section

Next, a mounting section 100 will be described.

Figure 2:
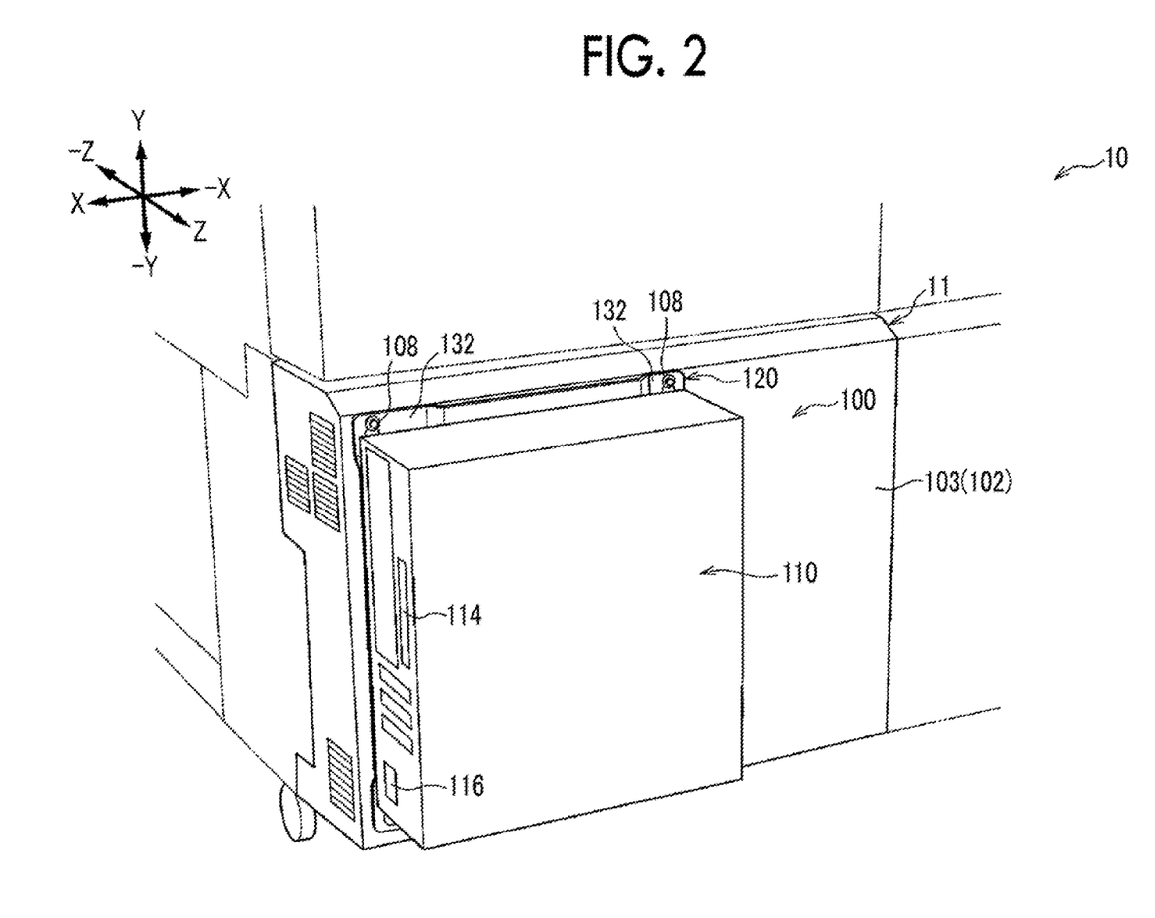
FIG. 2 is a perspective view of a part of the image forming apparatus according to the exemplary embodiment.

FIG. 2 illustrates a part of the image forming apparatus 10 on the Z side. As an example of the image forming apparatus 10, the mounting section 100 as an example of a mounting structure of an external device is provided in a portion on the X side and the −Y side on the Z side of the image forming apparatus 10.

The mounting section 100 has the apparatus body 11, the image processing device 110 as an example of the external device and the image processing section, and a mounting plate 120 as an example of a mounting member that causes the image processing device 110 to be mounted on the apparatus body 11.

Apparatus Body

Figure 3:
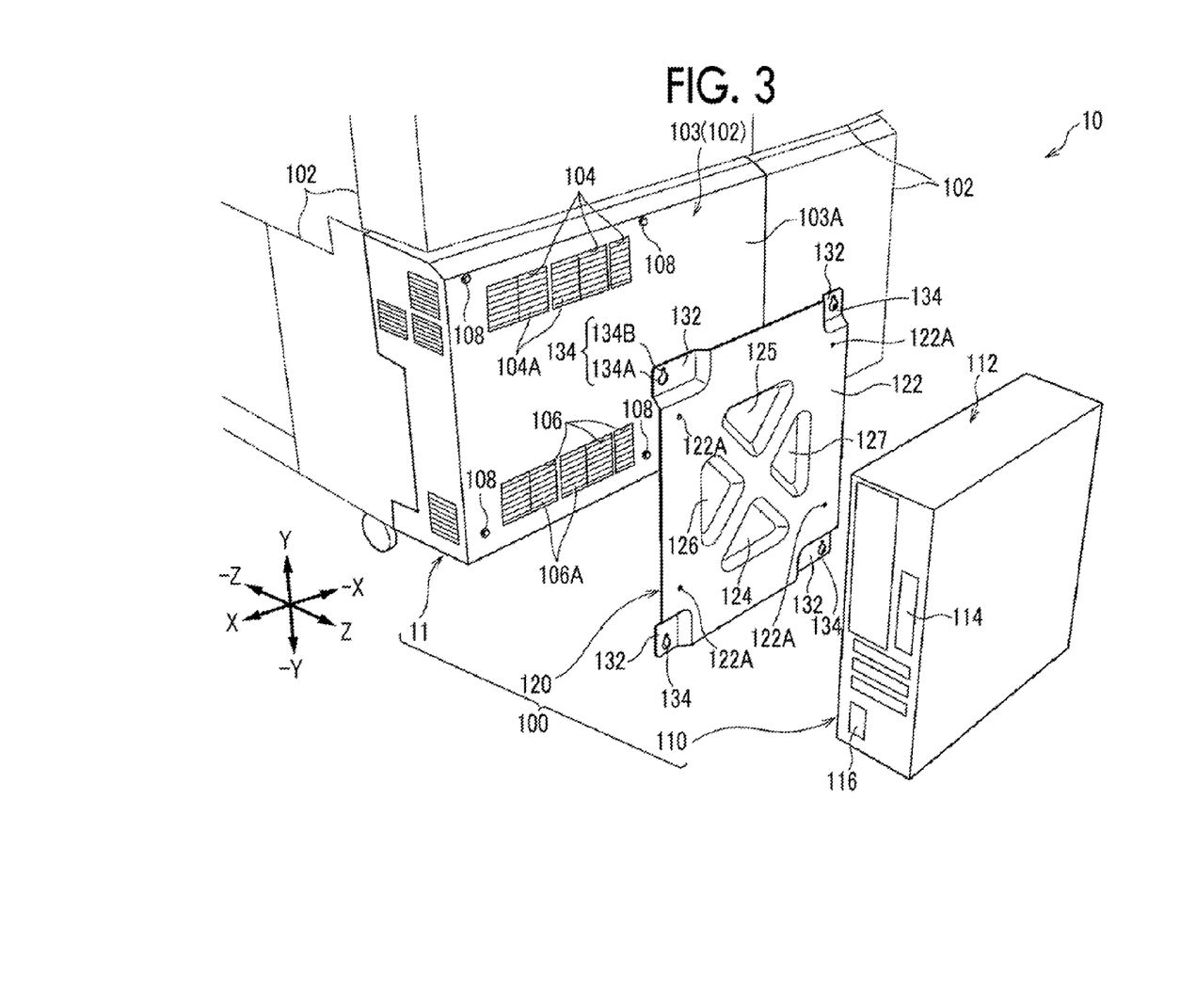
FIG. 3 is an exploded perspective view of a mounting section according to the exemplary embodiment.

As illustrated in FIG. 3, the apparatus body 11 has plural exterior covers 102 that cover the Z side of the image forming apparatus 10. Moreover, an exterior cover 103 on which the image processing device 110 is mounted is distinguished from the plural exterior covers 102.

The exterior cover 103 has a rear plate 103A along an X-Y plane. Plural first opening portions 104 as an example of a suction port are formed on the Y side with respect to the center of the rear plate 103A. Furthermore, plural second opening portions 106 as an example of an exhaust port are formed on the −Y side with respect to the center of the rear plate 103A. The plural first opening portions 104 and the plural second opening portions 106 are arranged at intervals in the Y direction.

Louvers 104A are respectively provided in the plural first opening portions 104 and allow gas between the inside and the outside of the exterior cover 103 to flow, and suppress intrusion of foreign matters (dust and the like) from the outside of the exterior cover 103. Furthermore, louvers 106A are respectively provided in the plural, second opening portions 106 and allow gas between the inside and the outside of the exterior cover 103 to flow, and suppress intrusion of foreign matters (dust and the like) from the outside of the exterior cover 103.

As an example, in the rear plate 103A, four fastening holes (not illustrated) are formed in portions on the X side and the −X side on the Y side from the plural first opening portions 104, and portions on the X side and the −X side from the plural second opening portions 106. Mounting screws 108 for mounting the mounting plate 120 on the rear plate 103A are fastened into the four fastening holes. Then, in a state where the mounting plate 120 is mounted on the rear plate 103A by the mounting screws 108, the plural first opening portions 104 and the plural second opening portions 106 are covered with the mounting plate 120 when the rear plate 103A is viewed in the Z direction.

Image Processing Device

As an example, the image processing device 110 is a personal computer in which an image processing program is accommodated. Furthermore, the image processing device 110 has a rectangular parallelepiped housing 112. A first connection section 114 that is connected to a substrate (not illustrated) in the image forming apparatus 10 through a cable (not illustrated) and a second connection section 116 that is connected to the power supply section 19 through the cable and is supplied with power from the power supply section 19 are provided on the rear surface side (X side in the view) of the housing 112.

In the image processing device 110, the image data input from the image forming apparatus 10 or the outside is processed (image processed) into gradation data of four colors of yellow (Y), magenta (M), cyan (C), and black (K). The image information, which is image-processed is transmitted to the image forming section 60 (see FIG. 1). Moreover, the housing 112 has a size to cover the first opening portions 104 and the second opening portions 106 viewed in the Z direction.

Here, a connection section (not illustrated) of each inputting and outputting cable in the image forming apparatus 10 is disposed on the Z side (behind and rear side) in the apparatus body 11. Furthermore, there is a concern that noise and the like occur if each cable (not illustrated) is longer than necessary. For these reasons, in the exemplary embodiment, the image processing device 110 is disposed on the Z side of the exterior cover 103 (the first opening portions 104 and the second opening portions 106).

Figure 4:
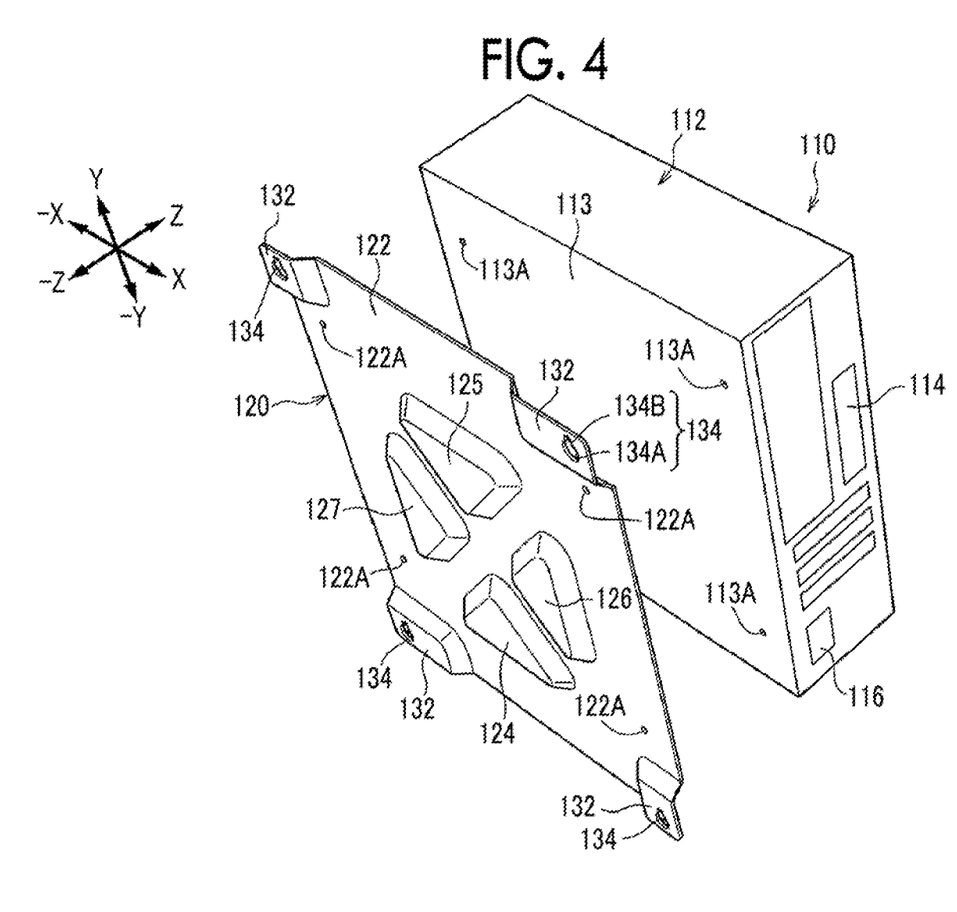
FIG. 4 is a perspective view of an image processing apparatus and a mounting plate according to the exemplary embodiment.

As illustrated in FIG. 4, fastening holes 113A for fastening the mounting plate 120 to the housing 112 are formed in a side plate 113 of the housing 112 on the −Z side. Moreover, in FIG. 4, three fastening holes 113A are indicated in FIG. 4, but four fastening holes 113A are practically formed. Furthermore, screws 115 (see FIG. 5) are capable of fastening into the fastening holes 113A.

Mounting Plate

As illustrated in FIG. 4, as an example, the mounting plate 120 has a planar body section 122, four protruding sections 124, 125, 126, and 127 protruding from the body section 122 toward one side (on the side of the apparatus body 11).

Body Section

The body section 122 is formed in a square shape viewed in the Z direction and has a size to cover the first opening portions 104 and the second opening portions 106. Furthermore, four mounted sections 132 that are protruded to one side (the apparatus body 11 side) respectively and are mounted on the apparatus body 11 are formed in four corners of the body section 122. Furthermore, four through holes 122A passing through the body section 122 in a thickness direction (Z direction) of the plate are formed in the body section 122 in accordance with the position of the four fastening holes 113A of the housing 112.

The four mounted sections 132 are planar portions along the X-y plane. Furthermore, a height (protruding amount in the Z direction) of the four mounted sections 132 from the body section 122 is H (see FIG. 5). A keyhole-shaped through hole 134 viewed in the Z direction is formed in each of the mounted sections 132. The through hole 134 has a circular first hole section 134A having a size capable of inserting a screw head of the mounting screw 108 (see FIG. 3) and an elongated second hole section 134B extending radially from a part of the first hole section 134A in the circumferential direction.

Protruding Section

Figure 6:
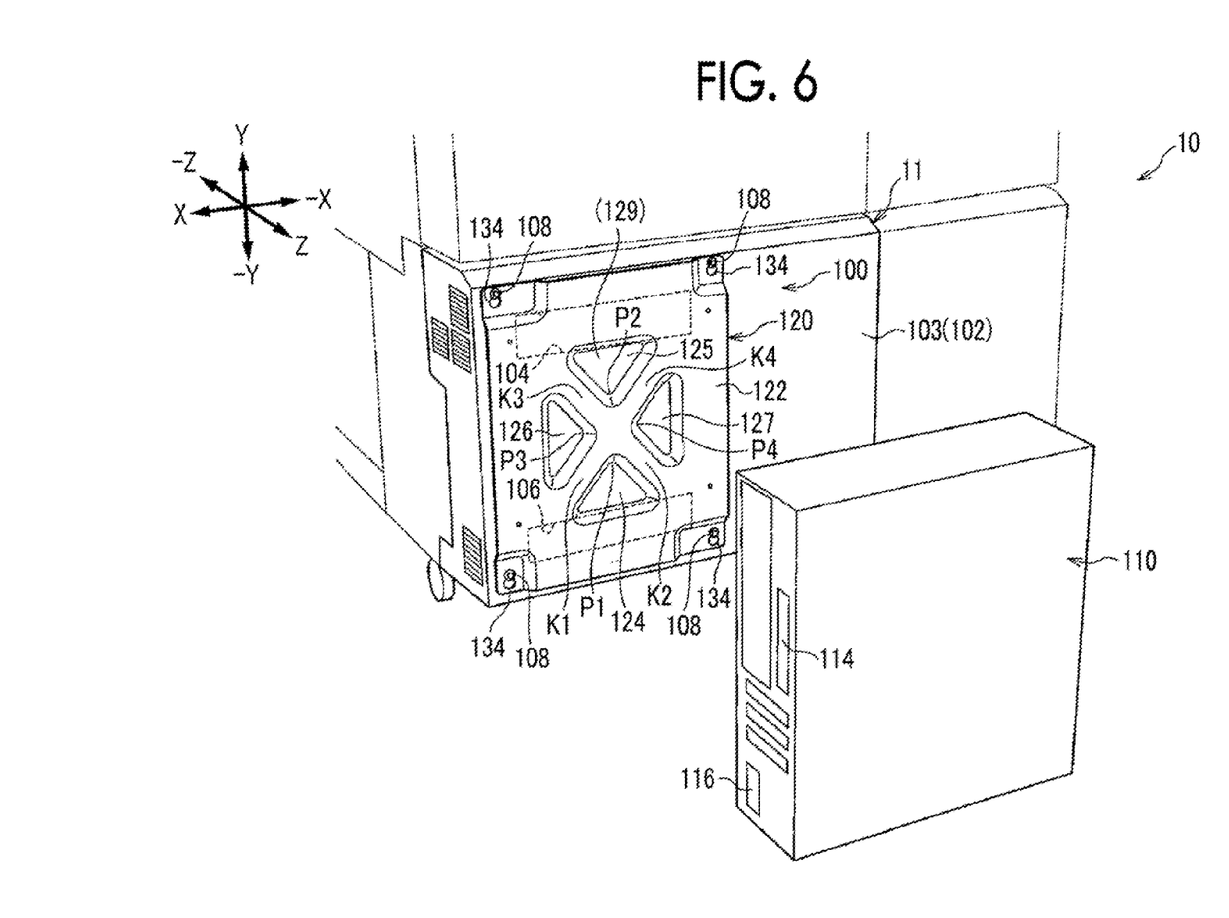
FIG. 6 is an explanatory view illustrating a state where the mounting plate is mounted on an apparatus body according to the exemplary embodiment.

As illustrated in FIG. 6, as an example, the protruding sections 124, 125, 126, and 127 are disposed in positions different from the first opening portions 104 and the second opening portions 106 viewed in the Z direction (in a transparent state) in a state where the mounting plate 120 is mounted on the apparatus body 11. Specifically, the protruding sections 124, 125, 126, and 127 are disposed between the first opening portions 104 and the second opening portions 106 viewed in the Z direction (protruding direction) and are adapted not to cover the first opening portions 104 and the second opening portions 106. Moreover, in order to represent the protruding sections 124, 125, 126, and 127, FIG. 6 illustrates a state where the image processing device 110 is removed from the mounting plate 120.

Furthermore, the protruding sections 124, 125, 126, and 127 have respectively a triangular bottom section 129 viewed in the Z direction (protruding direction) and are formed in a concave shape viewed from the Z side. The bottom section 129 is along the X-Y plane and a height thereof (protruding amount in the Z direction) from the body section 122 is H (see FIG. 5). Then, the bottom section 129 comes into contact with the apparatus body 11.

Furthermore, the protruding sections 124, 125, 126, and 127 are configured such that apexes P1, P2, P3, and P4 of triangles in bottom sections 129 are disposed to face the center portion of the body section 122. The center portion of the body section 122 is a portion that is a center in the X direction and a center in the Y direction in the body section 122. Moreover, the protruding section 124 is disposed on the −Y side with respect to the center portion of the body section 122 and the protruding section 125 is disposed on the Y side with respect to the center portion of the body section 122. Furthermore, the protruding section 126 is disposed on the X side with respect to the center portion of the body section 122 and the protruding section 127 is disposed on the −X side with respect to the center portion of the body section 122.

In addition, as an example, the protruding sections 124, 125, 126, and 127 have the same shape and the same size as each other, and are symmetrically disposed in the Y direction and the X direction. Then, flow paths K1, K2, K3, and K4 through which gas (not illustrated) flows are formed in the protruding sections 124, 125, 126, and 127 so as to intersect or branch between the body section 122 and the apparatus body 11, and in the center portion of the body section 122.

The flow path K1 is a space interposed between the protruding section 124 and the protruding section 126. The flow path K2 is a space interposed between the protruding section 124 and the protruding section 127. The flow path K3 is a space interposed between the protruding section 125 and the protruding section 126. The flow path K4 is a space interposed between the protruding section 125 and the protruding section 127. Furthermore, as an example, the flow path K1 and the flow path K4 are linearly disposed, and the flow path K2 and the flow path K3 are linearly disposed.

Moreover, in the protruding section 124, a side corresponding to a bottom side of the triangle is disposed on the Y side of the second opening portions 106 viewed in the Z direction. That is, the protruding section 124 comes into contact with the apparatus body 11 between the first opening portions 104 and the second opening portions 106, and is disposed so as so block a part of the flow path from the second opening portions 106 toward the first opening portions 104 along the Y direction.

Mounting of Image Processing Device

Figure 5:
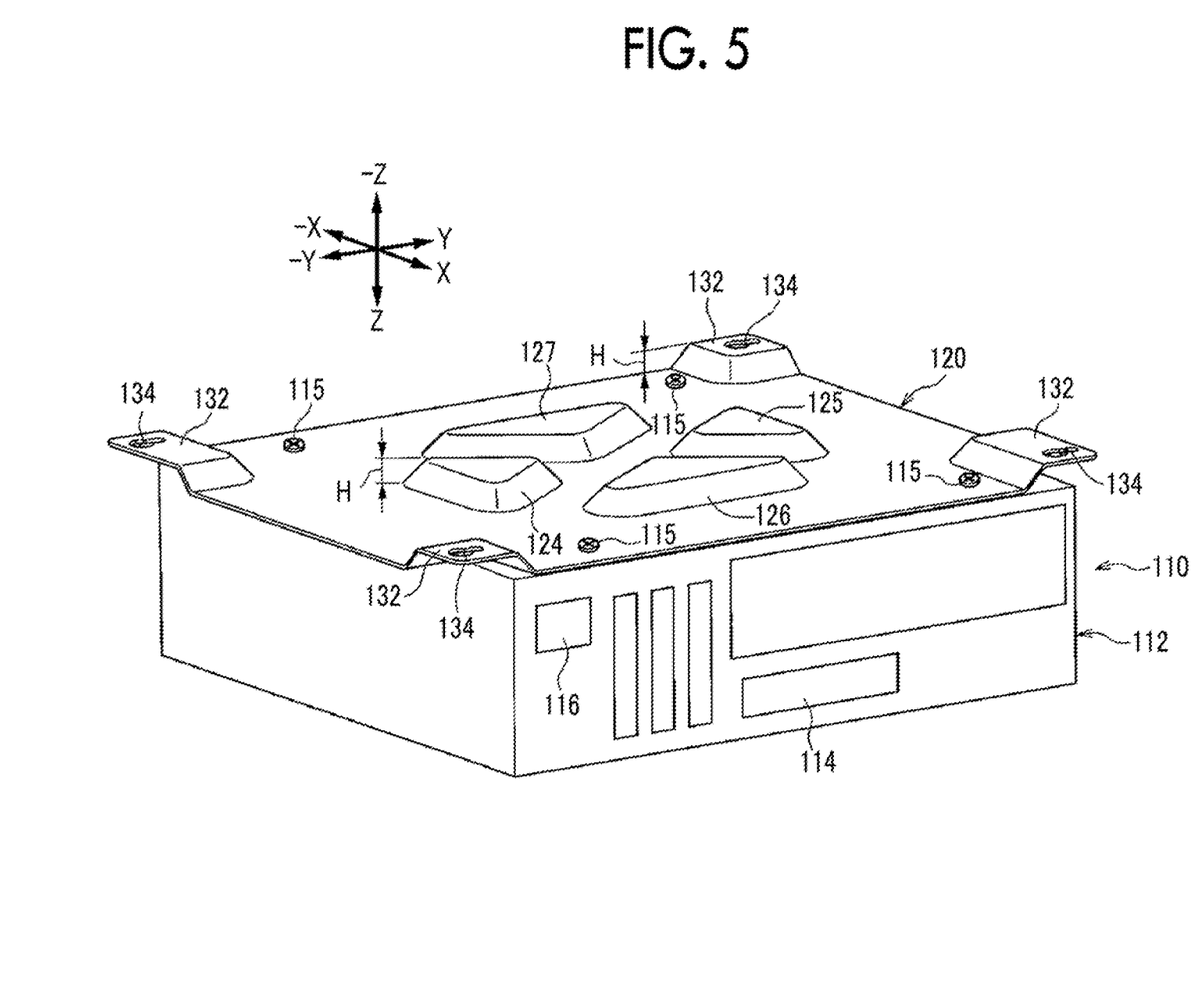
FIG. 5 is a perspective view illustrating a state where the mounting plate is mounted on the image processing apparatus according to the exemplary embodiment.

As illustrated in FIG. 5, the housing 112 of the image processing device 110 is mounted on the Z side (an example of one side) of the mounting plate 220 (the body section 122) using the screws 115. On the other hand, as illustrated in FIG. 3, the mounting screws 108 are provided in fastening holes (not illustrated) of the exterior cover 103 in a state of being loosed.

Subsequently, in the mounting plate 120 illustrated in FIG. 3, the screw head of the mounting screw 108 is inserted into the first hole section 134A. Therefore, the exterior cover 103 comes into contact with the mounted sections 132, and the protruding sections 124, 125, 126, and 127. Thereafter, a shaft section (not illustrated) of the mounting screw 108 is disposed in the second hole section 134B by lowering the mounting plats 120 on the −Y side. In this state, as illustrated in FIG. 6, the −Z side (an example of the other side) of the body section 122 is mounted on the apparatus body 11 by fastening the mounting screw 108 so as to cover the first opening portions 104 and the second opening portions 106. That is, the image processing device 110 is mounted on the apparatus body 11 through the mounting plate 120.

Here, the flow paths K1, K2, K3, and K4 are formed by mounting the mounting plate 120 on the apparatus body 11 so as to intersect or branch between the body section 122 and the apparatus body 11, and the center portion of the body section 122. Moreover, flow paths are also formed in portions other than the flow paths K1, K2, K3, and K4. That is, the mounting plate 120 has flow paths between the apparatus body 11 and the body section 122 other than the protruding sections 124, 125, 126, and 127.

Operation

Next, an operation of the exemplary embodiment will be described.

Figure 7:
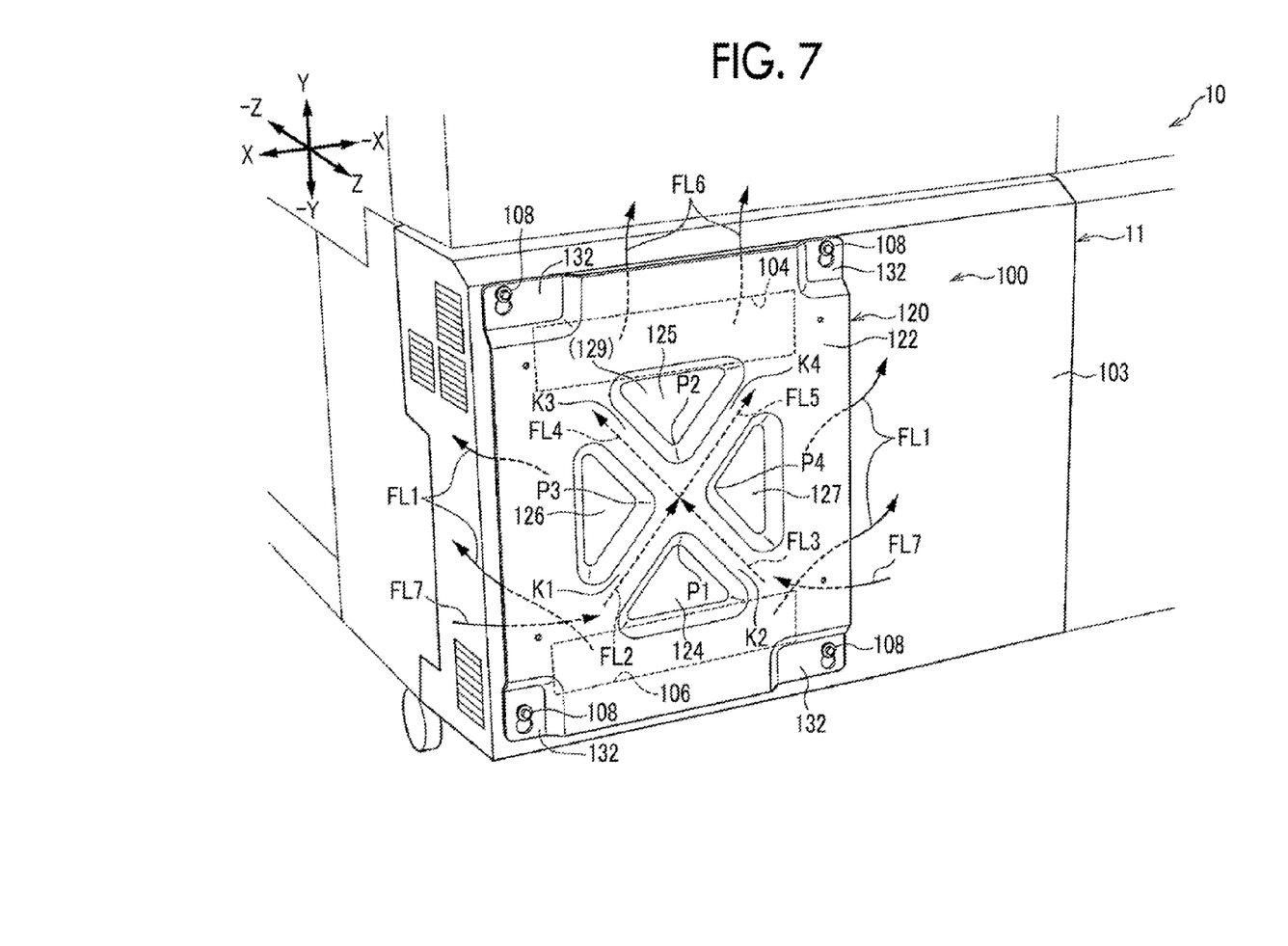
FIG. 7 is an explanatory view illustrating a state where gas flows through flow paths between the apparatus body and the mounting plate according to the exemplary embodiment.

As illustrated in FIG. 7, in the mounting section 100, when mounting the mounting plate 120 on the apparatus body 11, the apparatus body 11 comes into contact with the bottom section 129, and thereby a space is formed between the apparatus body 11 and the body section 122. Therefore, it is suppressed that the first opening portions 104 and the second opening portions 106 are closed by the mounting plate 120.

Furthermore, in the mounting section 100, the protruding sections 124, 125, 126, and 127 are disposed so as to intersect or branch the flow paths K1, K2, K3, and K4 with respect to the body section 122. Thus, bending rigidity of the mounting plate 120 is increased in plural directions (resistance to bending stress is increased in plural directions), compared to a case where the protruding sections are formed along one direction. Therefore, in the mounting section 100, even if the mass of the image processing device 110 (see FIG. 2) is great, the rigidity (mounting rigidity) for supporting the image processing device 110 is secured.

Here, since gas (air) exhausted from the second opening portions 106 is heated by the apparatus body 11, some of gas flows to the outside of the mounting plate 120 through a portion between the mounting plate 120 and the apparatus body 11 (flow FL1). Furthermore, other some of gas exhausted from the second opening portions 106 flows to the center portion along the flow path K1 (flow FL2) or flows to the center portion along the flow path K2 (flow FL3). The gas that reaches the center portion flows obliquely upward along the flow path K3 (flow FL4) or flows obliquely upward along the flow path K4 (flow FL5). The flow FL4 and the flow FL5 flow upward as flow FL6 and flow to the outside of the mounting plate 120, or are sucked by the first opening portions 104.

As described above, in the mounting section 100, the plural flow paths K1, K2, K3, and K4 formed by the protruding sections 124, 125, 126, and 127 are intersected or branched at the upper portion of the second opening portions 106. Thus, the gas exhausted from the second opening portions 106 is likely to flow upward, compared to a case where the flow paths K1, K2, K3, and K4 are not intersected or branched.

Furthermore, in the mounting section 100, since the protruding section 124 blocks a part of the flow paths from the second opening portions 106 to the first opening portions 104, an amount of the gas that is exhausted from the second opening portions 106 and directs to the center portion is decreased, compared to a configuration in which the protruding section 124 does not exist. Therefore, outside air FL7 that has flowed from the outside of the mounting plate 120 to the inside thereof is likely to flow inside the flow path, K1 and the flow path K2. Then, a temperature of the gas exhausted from the second opening portions 106 is cooled by the outside air that flows in.

Moreover, as an comparative example having no protruding section 124, a configuration having a flow path that sucks the exhausted gas, flow paths that are unlikely to suck the air due to scramble the air to be sucked together, and a flow path that is unlikely to exhaust the gas because the exhausted air is pressed is exemplified.

In addition, in the mounting section 100, the protruding sections 124, 125, 126, and 127 are formed in a triangle shape and the apexes P1, P2, P3, and P4 are disposed to face the center portion of the body section 122. Therefore, plural linear flow paths are formed toward the center portion of the body section 122 (portions corresponding to hypotenuses of the triangle form the flow paths). Thus, plural flow paths are obtained with a simple structure, compared to a case where the protruding section has a rectangular shape. Furthermore, since lengths of the flow paths of the gas flowing around the protruding sections 124, 125, 126, and 127 are shorter than those of the rectangular shape, flow of the gas from the second opening portions 106 to the first opening portions 104 is improved.

Furthermore, in the mounting section 100, the protruding sections 124, 125, 126, and 127 are symmetrically disposed in the Y direction and the X direction, and deviation of the flow FL2 and the flow FL5, or deviation of the flow FL3 and the flow FL4 is suppressed. Therefore, since the flow FL2 and the flow FL5 are linearly disposed, and the flow FL3 and the flow FL4 are linearly disposed, the flow of the gas is improved, compared to a case where plural protruding sections are asymmetrically arranged.

Furthermore, in the mounting section 100, since the protruding sections 124, 125, 126, and 127 are symmetrically disposed, the bending rigidities of the mounting plate 120 are equal to each other in each direction. Therefore, since it is suppressed that the bending rigidity is high in a certain direction but the bending rigidity is low in the other directions, balance of the bending rigidity of the mounting plate 120 is improved in plural directions. That is, the mounting rigidity of the mounting section 100 as a whole is increased.

In the image forming apparatus 10, it is suppressed that the first opening portions 104 and the second opening portions 106 are closed by the image processing device 110 by having the mounting section 100. Therefore, image defects (as an example, variation of image density) due to an increase in the temperature or humidity in the apparatus body 11 is suppressed, compared to a configuration that does not have the mounting section 100.

Moreover, the invention is not limited to the exemplary embodiments described above.

Modification Example

Figure 8:
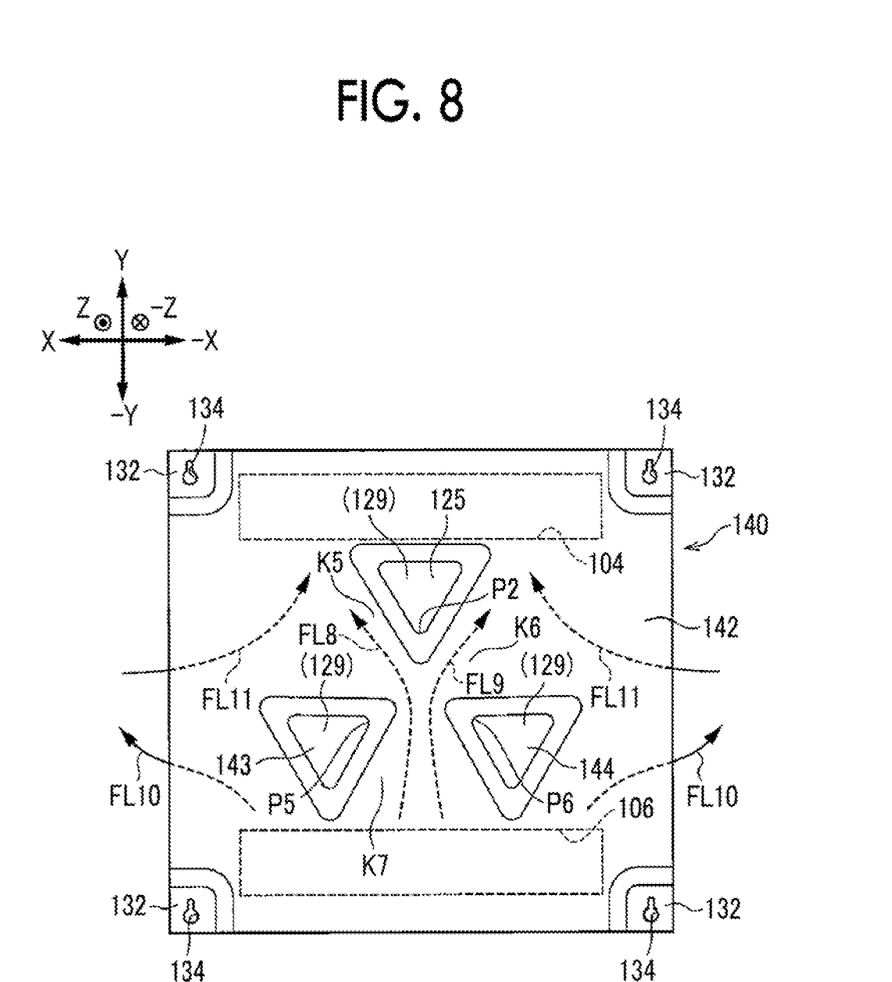
FIG. 8 is an explanatory view illustrating a mounting plate according to a modification example of the exemplary embodiment.

FIG. 8 illustrates a mounting plate 140 as an example of the mounting member as a modification example of the exemplary embodiment. The mounting plate 140 is provided in place of the mounting plate 120 (see FIG. 2) in the mounting section 100 (see FIG. 2) described above. Moreover, since the configurations other than the mounting plate 120 are the same as those of the mounting section 100, the descriptions thereof will be omitted. Furthermore, the same reference numerals are given to the basically same portions as those of the mounting plate 120 and the descriptions thereof will be omitted.

The mounting plate 140 has a rectangular body section 142 viewed in the Z direction. The mounted sections 132 are formed in four corners of the body section 142 and the through holes 134 are formed in the mounted sections 132. Furthermore, protruding sections 125, 143, and 144 protruding toward the −Z side are formed in the body section 142.

The protruding sections 125, 143, and 144 are disposed in position different from the first opening portions 104 and the second opening portions 106 viewed in the Z direction (in a transparent state) in a state where the mounting plate 140 is mounted on the apparatus body 11 (see FIG. 2). Specifically, the protruding sections 125, 143, and 144 are disposed in portions between the first opening portions 104 and the second opening portions 106 viewed in the Z direction, and are formed so as not to cover the first opening portions 104 and the second opening portions 106.

Furthermore, each of the protruding sections 125, 143, and 144 has the triangle bottom section 129 viewed in the Z direction (protruding direction). The bottom section 129 is along the X-Y plane and a height thereof (protruding amount in the Z direction) from the body section 142 is H (not illustrated).

Furthermore, the protruding sections 125, 143, and 144 are disposed such that apexes P2, P5, and P6 of the triangles in the bottom section 129 are disposed to face the center portion of the body section 142 and are deviated by 120° respectively. The center portion of the body section 142 is a portion that is the center portion in the X direction and the center portion in the Y direction in the body section 142. Moreover, the protruding section 143 is disposed on the X side and the −Y side with respect to the protruding section 125 and the protruding section 144 is disposed on the −X side and the −Y side with respect to the protruding section 125. In addition, the protruding sections 125, 143, and 144 have the same shape and the same size as each other.

When one mounting plate 140 is mounted on the apparatus body 11 (see FIG. 2), the apparatus body 11 comes into contact with the bottom section 129, and thereby a space is formed between the apparatus body 11 and the body section 142. Therefore, in the modification example, it is suppressed that the first opening portions 104 and the second opening portions 106 are closed by the mounting plate 140. Moreover, a flow path K5 is formed between the protruding section 125 and the protruding section 143, a flow path K6 is formed between the protruding section 125 and the protruding section 144, and a flow path K7 is formed between the protruding section 143 and the protruding section 14 4.

Here, some of the gas (air) exhausted from the second opening portions 106 flow upward in the flow path K7 and flow in the flow path K5 or the flow path K6, and flow to the outside of the mounting plate 140 (flow FL8 and flow FL9). Furthermore, other some of the gas exhausted from the second opening portions 106 is guided by the protruding section 143 or the protruding section 144 and flow to the outside of the mounting plate 140 (flow FL10). Furthermore, outer air FL11 that flows from the outside of the mounting plane 140 to the inside thereof flows upward on the X side or the −X side of the protruding section 125, and is sucked by the first opening portions 104, or flows to the outside of the mounting plate 140.

As described above, in the modification example, the protruding sections 125, 143, and 144 are disposed so as to intersect or branch the flow paths K5, K6, and K7 with respect to the body section 142. Thus, the bending rigidity of the mounting plate 140 is increased in plural directions (resistance to bending stress is increased in plural directions), compared to a case where the protruding sections are formed along one direction. Therefore, in the modification example, even if the mass of the image processing device 110 (see FIG. 2) is great, the mounting rigidity for supporting the image processing device 110 is secured.

Other Modification Example

The exemplary embodiment is not limited to a case where the first opening portions 104 are the suction port and the second opening portions 106 are the exhaust port, and the first opening portions 104 may be the exhaust port and the second opening portions 106 may be the suction port. In this case, the exhaust gas from the second opening portions 106 is changed to the outer air, but it is the same operation as the flow of the gas. Furthermore, when the first opening portions 104 and the second opening portions 106 are the suction port, the exhaust gas is changed to the outer air and thus when the first opening portions 104 and the second opening portions 106 are the exhaust port, the same operation as that of the exemplary embodiment is performed. Furthermore, one of the first opening portions 104 and the second opening portions 106 may not exist.

The protruding section is not limited to the triangle and may be another polygonal or circular. Furthermore, arrangement of plural protruding sections is not limited to a case where the apexes face the center portion and the apexes may not face the center portion. Furthermore, the protruding section may not block a part of the flow paths. In addition, plural protruding sections may have different shapes and different sizes. Furthermore, plural protruding sections may be asymmetrically disposed.

Furthermore, the protruding sections are not limited to be integrally formed, with the body sections 122 and 142, and may foe mounted on the body section as a separate body.

The position in which the mounting section 100 is provided is not limited to the z side of the apparatus body 11 and may be the X side or the −X side.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and wish the various modifications as are suited to the particular use contemplated. It is intended that the scope of the invention be defined by the following claims and their equivalents.

What is claimed is:

1. An image forming apparatus comprising:
   a mounting structure of an external device comprising
      an apparatus body in which an exhaust port or a suction port are formed,
      an external device that is connected to the apparatus body, and
      a mounting member that includes a body section having one side on which the external device is mounted and the other side which is mounted on the apparatus body so as to cover the exhaust port or the suction port, and a plurality of protruding sections which protrude from the body section and come into contact with the apparatus body in positions different from the exhaust port or the suction port, and that is provided to make flow paths at portions other than the plurality of protruding sections so as to intersect or branch between the body section and the apparatus body, and at a center portion of the body section; and
   an image forming section that is providing in the apparatus body and forms an image on a recording medium based on image information transmitted from the external device.

2. The image forming apparatus according to claim 1, wherein
   the body section covers a plurality of exhaust ports or suction ports, and
   wherein the protruding sections come into contact with the apparatus body between the exhaust port or the suction port of one side and the exhaust port or the suction port of the other side.

3. The image forming apparatus according to claim 1, wherein
   the plurality of protruding sections are formed in a triangular shape as viewed in a protruding direction and are disposed such that apexes thereof face the center portion.

4. The image forming apparatus according to claim 2, wherein
   the plurality of protruding sections are formed in a triangular shape as viewed in a protruding direction and are disposed such that apexes thereof face the center portion.

5. The image forming apparatus according to claim 3, wherein
   the plurality of protruding sections are formed at four positions so as to be symmetrically arranged in a vertical direction and a horizontal direction.

6. The image forming apparatus according to claim 4, wherein
   the plurality of protruding sections are formed at four positions so as to be symmetrically arranged in a vertical direction and a horizontal direction.

7. The image forming apparatus according to claim 1, wherein
   the plurality of protruding sections have different shapes and different sizes.

8. The image forming apparatus according to claim 1, wherein
   the plurality of protruding sections are mounted on the body section as a separate body.

* * * * *